United States Patent
Wang et al.

(10) Patent No.: US 12,145,708 B2
(45) Date of Patent: Nov. 19, 2024

(54) COOLING SHELL, CHASSIS, MARINE ELECTRIC PROPULSOR, AND COOLING CONTROL METHOD

(71) Applicant: GUANGDONG EPROPULSION TECHNOLOGY LIMITED, Dongguan (CN)

(72) Inventors: Haiyang Wang, Dongguan (CN); Qiang Wang, Dongguan (CN); Xing Li, Dongguan (CN); Shizheng Tao, Dongguan (CN); Xiaokang Wan, Dongguan (CN)

(73) Assignee: GUANGDONG EPROPULSION TECHNOLOGY LIMITED, Dongguan (CN)

( * ) Notice: Subject to any disclaimer, the term of this patent is extended or adjusted under 35 U.S.C. 154(b) by 0 days.

(21) Appl. No.: 18/670,670

(22) Filed: May 21, 2024

(65) Prior Publication Data

US 2024/0308637 A1    Sep. 19, 2024

Related U.S. Application Data

(63) Continuation of application No. PCT/CN2022/141423, filed on Dec. 23, 2022.

(30) Foreign Application Priority Data

Dec. 24, 2021 (CN) .......................... 202111604252.1

(51) Int. Cl.
*B63H 21/17* (2006.01)
*H05K 7/20* (2006.01)

(52) U.S. Cl.
CPC .......... *B63H 21/17* (2013.01); *H05K 7/20145* (2013.01)

(58) Field of Classification Search
CPC ............................ B63H 21/17; H05K 7/20145
See application file for complete search history.

(56) References Cited

U.S. PATENT DOCUMENTS

2018/0007810 A1* 1/2018 Sasaki ................ H05K 7/20154

FOREIGN PATENT DOCUMENTS

| CN | 211656720 U | 10/2020 | |
|---|---|---|---|
| CN | 112153873 A | 12/2020 | |
| DE | 102013105572 A1 * | 12/2013 | ............. F28D 15/02 |

OTHER PUBLICATIONS

First Office Action issued in related Chinese Application No. 202111604252.1, mailed Jul. 20, 2023, 8 pages.

* cited by examiner

*Primary Examiner* — Stephen P Avila
(74) *Attorney, Agent, or Firm* — BAYES PLLC

(57) ABSTRACT

The present application provides a cooling shell, a chassis, a marine electric propulsor, and a cooling control method. The cooling shell includes a shell body and the shell body includes a fin portion, a heating component installation portion, and a cooling component installation groove. The heating component installation portion is formed on one side of the shell body in the first direction for installing the heating component. The cooling component installation groove is formed on the other side of the shell body for accommodating the cooling component. A connected flow channel is formed between the fin portion and the cooling component installation groove.

17 Claims, 11 Drawing Sheets

COOLING SHELL, CHASSIS, MARINE ELECTRIC PROPULSOR, AND COOLING CONTROL METHOD

CROSS-REFERENCE TO RELATED APPLICATION

This application is a continuation of International Application No. PCT/CN2022/141423, filed on Dec. 23, 2022, which claims priority to Chinese Patent Application No. 202111604252.1, filed on Dec. 24, 2021. The entire contents of each of the above-referenced applications are expressly incorporated herein by reference.

TECHNICAL FIELD

This application relates to the field of cooling technology, in particular, to cooling shells, chassis, marine electric propulsors, and a cooling control method.

TECHNICAL BACKGROUND

A marine electric propulsor refers to a propulsion device installed on the hull (ship side) and can be used for fishing, leisure, water sports, and other occasions. Depending on the energy source, marine propulsors are divided into fuel propulsors and electric propulsors. Among them, electric propulsors use rechargeable batteries as the energy source and convert electrical energy into kinetic energy through electric motors. The control device is used on the electric propulsor to control the power and direction of the propulsor.

In the relevant technology, the chassis of the marine electric propulsor is equipped with drive components (including motor, drive circuit board, and other parts). The drive components are used to control the operation of the marine electric propulsor. During the operation of the marine electric propulsor, the drive components generate heat. In order to avoid the drive components from overheating and causing the marine electric propulsor to shut down, it is generally necessary to cool the drive components. Currently, the cooling performance of the cooling methods for marine electric propulsors is poor.

SUMMARY

In view of the problems in the existing technology, the purpose of this application is to provide a cooling shell, chassis, marine electric propulsor, and cooling control method to solve the problem of poor heat dissipation performance of the current cooling method used in marine electric propulsors.

To solve the above technical problems, this application provides the following technical solutions.

In the first aspect, this application provides a cooling shell, including a shell body. The shell body includes: a fin portion, a heating component installation portion, and a cooling component installation groove. On one side of the shell body in a first direction, there is a heating component installation portion for installing a heating component. On the other side of the shell body, there is a cooling component installation groove for accommodating a cooling component. A connected flow channel is formed between the fin portion and the cooling component installation groove.

The beneficial effect of this technical solution is that the heating component installation portion of the cooling shell is used to install the heating component, and the cooling component installation groove accommodates the cooling component. The heating component installation portion and the cooling component installation groove are located on opposite sides in the first direction. A flow channel is formed between the fin portion and the cooling component installation groove. The heating component, cooling component, and fin portion are set close to each other, allowing heat to be quickly transferred and dissipated from the flow channel, thereby improving the cooling efficiency and achieving better cooling effect.

Furthermore, the fin portion and the cooling component installation groove are located on the same side of the shell body, and the fin portion is arranged around the cooling component installation groove; and the fin portion includes multiple fins, and a flow channel communicating with the cooling component installation groove is formed between two adjacent fins.

The advantageous effect of this technical solution is that it can increase the contact area of the fins, resulting in better cooling effect.

Furthermore, fin portions are formed on both sides of the cooling component installation groove in second direction. The fins are arranged in a third direction, and the first direction and the second direction are both perpendicular to the third direction.

The beneficial effect of this technical solution is that it can increase the number of the fins, thereby increasing the heat dissipation area of the fins and improving the heat dissipation effect.

Furthermore, a projection of the fins in the first plane extends obliquely with respect to the second direction, and both the second direction and the third direction are parallel to the first plane.

The beneficial effect of this technical solution is that compared to the projection of the fins in the first plane being perpendicular or parallel to the second direction, by setting the projection of the fins to be inclined and extended relative to the second direction, it can increase the size of the fins within the limited length of the shell body, thereby increasing the heat dissipation area of the fins and improving the heat dissipation performance.

Furthermore, the projection of the fins in the first plane includes a curved extension segment.

The advantageous effect of this technical solution is that, on one hand, it can further increase the length of the fins, and on the other hand, it makes it difficult for the user to see the cooling component inside the cooling component installation groove from the second direction, thereby improving the user's perception of the electric propulsor.

Furthermore, the angle between the extension direction of the projection and the second direction is 10° to 30°.

Furthermore, the projection of the fins in a second plane extends obliquely relative to the first direction, and both the first direction and the third direction are parallel to the second plane.

The beneficial effect of this technical solution is that compared to making the projection of the fins relative to the second plane perpendicular or parallel to the first direction, it can increase the size of the fins within the limited size of the shell, increase the heat dissipation area of the fins, improve the heat dissipation capacity, and also make it difficult for users to see the cooling component in the cooling component installation groove in the second direction through the flow channel, thereby improving the user's perception of the electric propulsor.

Furthermore, the fins extend obliquely relative to the first direction from a position near the cooling component installation groove towards the direction near the heating component installation portion.

The beneficial effect of this technical solution is that it can increase the contact area of the fins, resulting in better cooling effect. A cooling component installation groove is formed on the shell, which facilitates the installation of the cooling component and reduces the overall volume of the Chassis.

Furthermore, the cooling component installation groove at least partially overlaps with the heating component installation portion in the first direction.

The beneficial effect of this technical solution is that it increases the contact area between the cooling component and the heating component after installation, and the position of the cooling component installation groove is close to the heating component installation portion, which enhances the cooling effect.

Furthermore, the cooling component installation groove at least partially overlaps with the heating component installation portion in the first direction.

Furthermore, the projected length of the fins in the first plane is greater than the width of the flow channel.

The advantageous effect of this technical solution is that it can prevent the user from easily seeing the internal structure through the flow channel, providing a blocking effect. Additionally, it makes it difficult for the user to see the cooling component inside the cooling component installation groove in the second direction through the flow channel, thereby improving the user's perception of the marine electric propulsor.

Furthermore, the shell includes reinforcing ribs that extend in the third direction, and the reinforcing ribs are formed at the bottom of the cooling component installation groove. The fin portions on both sides of the cooling component installation groove are fixedly connected to the reinforcing ribs, and the flow channel extends to the reinforcing ribs in the second direction.

The beneficial effect of this technical solution is that: the flow channel extends to the reinforcing ribs in the second direction, which increases the length of the flow channel and improves the heat dissipation capacity. It also increases the length of the fins, thereby increasing the heat dissipation area and improving the heat dissipation capacity. By setting the reinforcing ribs, the lifting demand of the cooling shell can be met. Specifically, the lifting demand refers to the need for the marine electric propulsor to lift the propeller part when it is not in use, so that the propeller is away from the water surface and avoids long-term immersion in water. During the lifting process, the reinforcing ribs can increase the rigidity of the cooling shell, prevent deformation of the cooling shell due to lifting, and meet the lifting demand of the cooling shell.

Furthermore, the cooling component installation groove is used to install the cooling component, the cooling component includes: fan and/or water cooling module.

Furthermore, the heating component installation portion is provided with a thermal conductive silicone grease layer on the surface for installing the heating component.

In second aspect, the present application provides a chassis, the chassis including the cooling shell.

Furthermore, the chassis includes a bottom cover, which is installed on the cooling shell. The bottom cover includes a main body that covers the notch of the heating component installation groove.

The advantageous effect of this technical solution is that the probability of foreign objects entering the heating component installation groove and causing the heating component to malfunction can be reduced by using the bottom cover.

Furthermore, a through hole is formed on the main body in the first direction, and the through hole penetrates through the main body.

The advantageous effect of this technical solution is that the airflow in the cooling component installation groove can flow normally by setting the through hole.

Furthermore, there are multiple through holes, and the opening rate of the through holes on the main body is 40%-90%.

The advantageous effect of this technical solution is that it can ensure the strength of the foreign object baffle while also ensuring the air intake volume.

Furthermore, the bottom cover is detachably connected to the cooling shell.

The advantageous effect of this technical solution is that when the cooling component is damaged, it can be replaced without replacing the entire chassis, saving costs and making disassembly and installation more convenient and user-friendly.

Furthermore, the bottom cover also includes two foreign object baffles. The foreign object baffles are formed on one side surface of the main body facing the cooling component installation groove, and the foreign object baffles extend into the cooling component installation groove.

The beneficial effect of this technical solution is that during installation, the cooling component is first placed on the main body, with the cooling component located between the two foreign object baffles. Then, align the bottom cover with the notch of the cooling component installation groove. The cooling component and the two side foreign object baffles are located inside the cooling component installation groove, and the cooling component is encapsulated inside, effectively blocking foreign objects from entering and causing the cooling component to malfunction.

Furthermore, the chassis includes a top shell that is connected to the cooling shell. A housing cavity forms between the top shell and the cooling shell, which is used to install the heating component.

The beneficial effect of this technical solution is that it can protect the heating component while ensuring its normal operation.

Furthermore, the chassis includes a heating component and a cooling component, where the heating component is installed on the heating component installation portion, and the cooling component is installed in the cooling component installation groove.

The beneficial effect of this technical solution is that the cooling components can be easily installed, which can reduce the volume of the entire chassis and effectively improve the cooling effect of the heating component.

In third aspect, this application provides a marine electric propulsor. The marine electric propulsor includes the heating component and the chassis.

The heating component includes a driving component of the marine electric propulsor, and the heating component is installed on the heating component installation portion.

The beneficial effect of this technical solution is that by increasing the contact area of the fins, the cooling effect of the driving component of the marine electric propulsor is better. A cooling component installation groove is formed on the shell, which facilitates the installation of the cooling components, reduces the volume of the entire chassis of the marine electric propulsor, and effectively improves the cooling effect of the driving component in the marine electric propulsor, as well as the overall convenience of use.

Furthermore, the driving component, motor, and battery of the marine electric propulsor are equipped with temperature sensors, which are used to detect temperature signals and send them to the control module of the marine electric propulsor.

The motor and cooling component of the marine electric propulsor are also equipped with speed sensors, which are used to detect motor speed signals and cooling component speed signals, and send them to the control module. The control module is also connected to the motor and cooling component, and is used to receive temperature signals, motor speed signals, and cooling component speed signals, as well as to control the speed of the motor and cooling component.

The beneficial effect of this technical solution is that by setting multiple sensors, the control module of the marine electric propulsor can perform timely and automatic cooling treatment on each heating component on the marine electric propulsor, thereby further improving the application reliability and service life of the marine electric propulsor.

In fourth aspect, the present application provides a cooling control method, wherein the cooling control method comprises:

Determining whether the current state of the marine electric propulsor meets the cooling conditions, where the cooling conditions include: at least one of meeting the throttle information not being zero; the motor output power being greater than the preset first power threshold; or the heating component temperature being higher than the preset first temperature threshold;

If the current state of the marine electric propulsor meets the cooling conditions, the cooling component is controlled to open for cooling the driving component.

Determine whether the target level of the cooling component is the same as the current level according to the received temperature signal and/or the motor speed signal when the cooling component is turned on.

If the target level is different from the current level, the cooling component is controlled to switch from the current level to the target level.

The beneficial effect of this technical solution is that by automatically switching the level of the cooling component, the intelligent cooling level of the heating components such as the driving components in the marine electric propulsor can be further improved.

Furthermore, the cooling component includes: fan and/or water cooling module;

If the cooling component is a fan, the cooling control method also includes the following steps.

Before determining whether the current state of the marine electric propulsor meets the cooling conditions, the cooling control method further includes the following.

Controlling the fan to power on for self-check, where the self-check includes: if the fan does not rotate during the preset duration in the preset mode, outputting a notification message indicating a fan failure.

The beneficial effect of this technical solution is that the reliability of cooling control can be improved by performing fan self-check during power-on.

From the above technical solution, this application provides a cooling shell, chassis, marine electric propulsor, and cooling control method. When in use, the heating component is installed in the heating component installation portion, and the cooling component is installed in the cooling component installation groove. The cooling component is activated to transfer the heat generated by the heating component to the fin portion and away from the heating component. Inside the fin portion, airflow carries the heat and flows through the channel to dissipate the heat. At the same time, the heating component also directly transfers the heat generated to the fins because both the heating component installation portion and the fins are part of the cooling shell. If the cooling component is a fan, the heat on the fins will also be taken away when the fan generates airflow through the channel. The fins are inclined and extend in a direction closer to the heating component installation portion from a position near the cooling component installation groove, relative to the first direction. This increases the contact area of the fins and improves the cooling effect. A cooling component installation groove is formed on the shell, which facilitates the installation of the cooling component and reduces the overall volume of the chassis.

BRIEF DESCRIPTION OF DRAWINGS

In order to clearly explain the technical solutions in the embodiments or related art of the present application, the following will briefly introduce the drawings that need to be used in the description of the embodiments or related art. It is obvious that the drawings described below are some embodiments of the present application, and ordinary skilled technicians in this field can obtain other drawings based on these drawings without creative labor.

REFERENCE MARKS IN THE DRAWINGS

Figure 1:
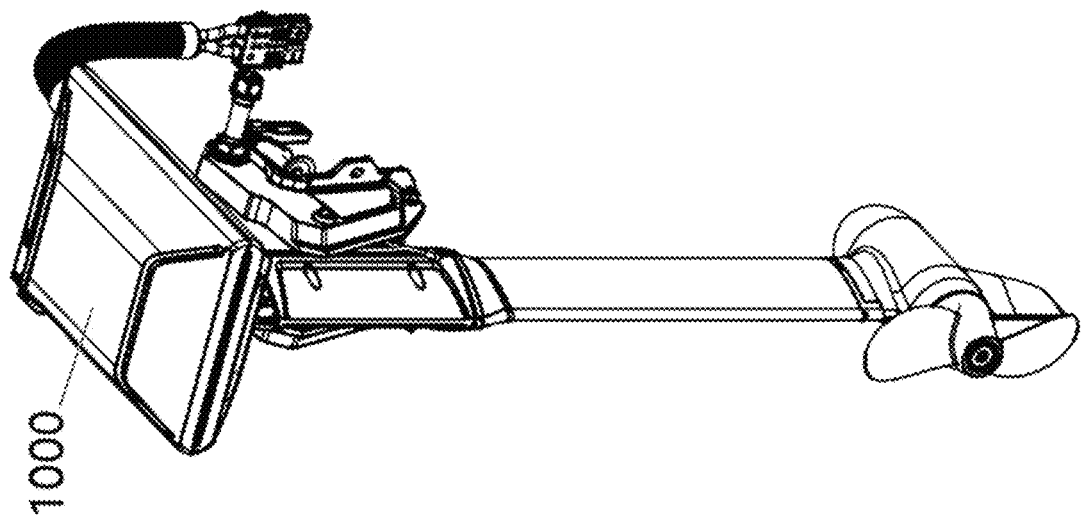
FIG. 1 is a stereoscopic structural diagram of a marine electric propulsor, according to some embodiments of the present application.
Figure 2:
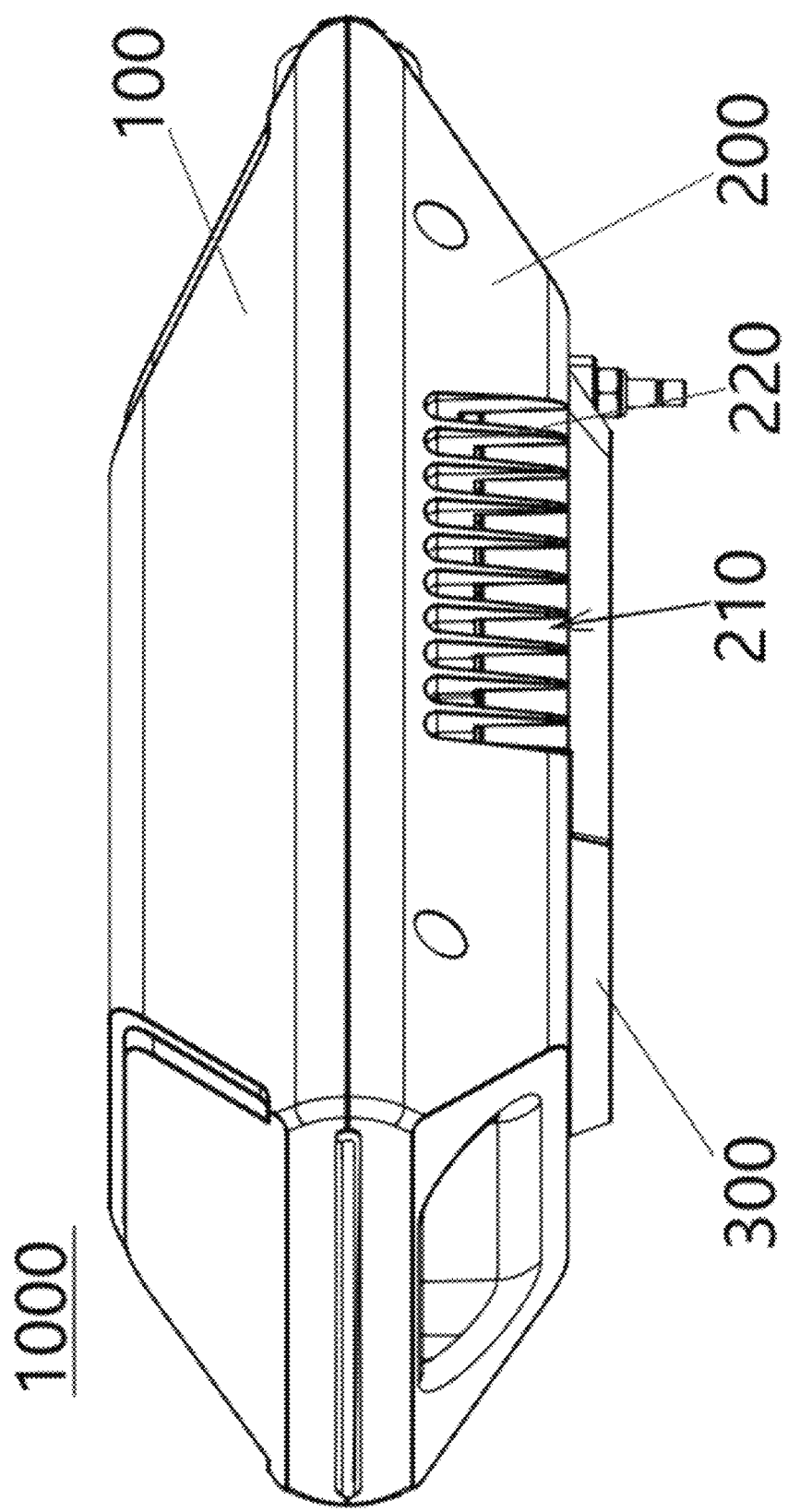
FIG. 2 is a stereoscopic structural diagram of a chassis, according to some embodiments of the present application.

1000—Chassis;
100—Top shell;
200—Cooling shell;
210—Flow channel;

220—Fins;
230—Heating component installation portion;
240—Reinforcing rib;
250—Cooling component installation groove;
300—Bottom cover;
310—Foreign object baffle;
320—Main body;
321—Through hole;
400—Heating component; and
500—Fan.

DETAILED DESCRIPTION

In order to make the purpose, technical solution, and advantages of the present application embodiment clearer, the technical solution in the present application embodiment will be described clearly and completely in conjunction with the accompanying drawings in the present application embodiment. Obviously, the described embodiment is a part of the embodiments of the present application, not all of the embodiments. Based on the embodiments in the present application, all other embodiments obtained by those skilled in the art in the field without making creative efforts are within the scope of protection of the present application.

In the description of this application, it needs to be clarified that terms such as "center," "up," "down," "left," "right," "vertical," "horizontal," "inner," "outer," etc. indicate the orientation or positional relationship based on the orientation or positional relationship shown in the accompanying drawings. They are only used for the convenience of describing and simplifying this application, and do not indicate or imply that the device or component referred to must have a specific orientation or be constructed and operated in a specific orientation. Therefore, they should not be understood as limitations to this application. In addition, the terms "first," "second," "third" are only used for descriptive purposes and should not be understood as indicating or implying relative importance.

In the description of this application, it needs to be clarified that unless otherwise expressly specified and limited, terms such as "installation," "connection," "linking" should be broadly understood. For example, it can be a fixed connection or a detachable connection, a mechanical connection or an electrical connection, a direct connection or an indirect connection through an intermediate medium, or a connection within two components. For ordinary skilled persons in this field, they can understand the specific meanings of the above terms in this application based on specific circumstances.

As shown in FIGS. 1 to 7, one aspect of the present application provides a cooling shell 200, including a shell body. The shell body includes: a fin portion, a heating component installation portion 230, and a cooling component installation groove 250. On one side of the shell body in the first direction α1, the heat generating element installation portion 230 is formed, which is used to install the heat generating element 400. On the other side of the shell body, the cooling component installation groove 250 is formed, which is used to accommodate the heat dissipation element. A connected flow channel 210 is formed between the fin portion and the cooling component installation groove 250. In other words, a cavity for accommodating a fan can be formed on the heat dissipation fin, achieving enclosed installation and improving the cooling efficiency.

In an embodiment of the cooling shell 200, the fin portion and the cooling component installation groove 250 are located on the same side of the shell body, and the fin portion is arranged around the cooling component installation groove 250; the fin portion includes multiple fins 220, and a flow channel communicating with the cooling component installation groove 250 is formed between two adjacent fins 220.

Specifically, this application does not limit the division criteria for the number of fin portion, which can be regarded as one or more.

In one or more embodiments of this application, in addition to installing a fan in the cooling component installation groove 250 to cool the heating component by air, a water pump may also be installed in the cooling component installation groove 250 to cool the heating component by water. In other words, the cooling component can be a cooling device such as a fan or a water cooling module, and it can also include both a fan and a water cooling module. The water cooling module may include a water pump and a water circuit, which can be set according to actual application requirements. Other cooling devices besides the fan and water cooling module mentioned in this application are also within the scope of protection of the cooling component. The following embodiment is described in detail using the example of the cooling component being a fan 500 for ease of understanding.

In an embodiment of the cooling shell 200, the fin portion is formed on both sides of the cooling component installation groove 250 in the second direction, and the second direction is perpendicular to the first direction. Of course, the arrangement direction of each fin 220 can also be inclined relative to the second direction.

Figure 3:
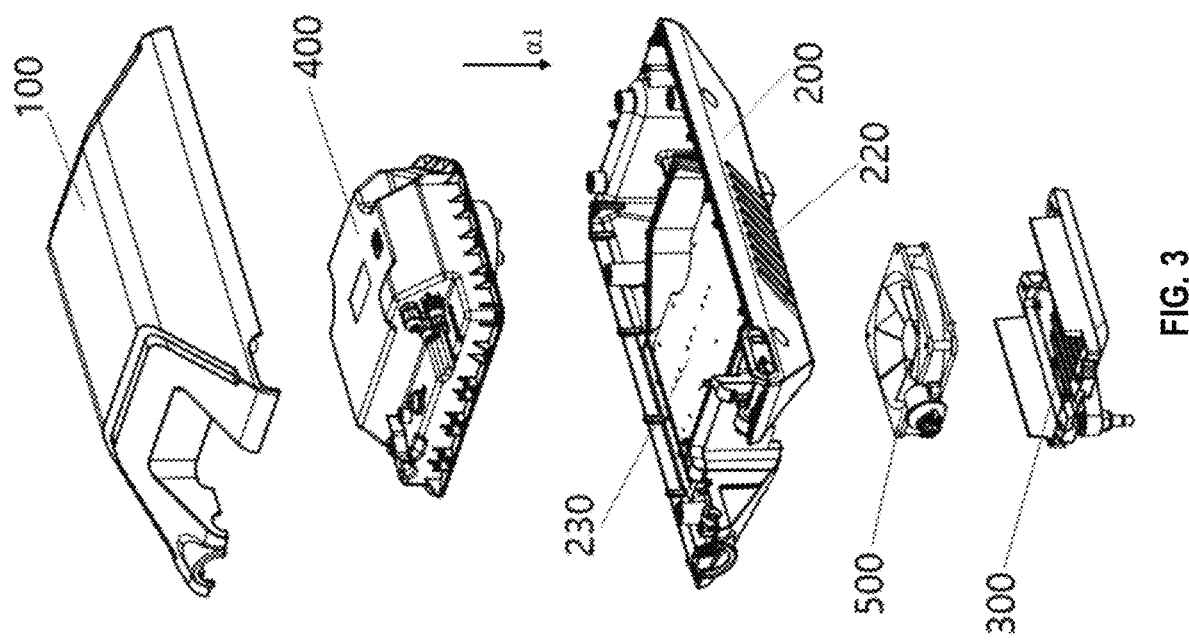
FIG. 3 is an exploded structural diagram of the chassis, according to some embodiments of the present application.
Figure 4:
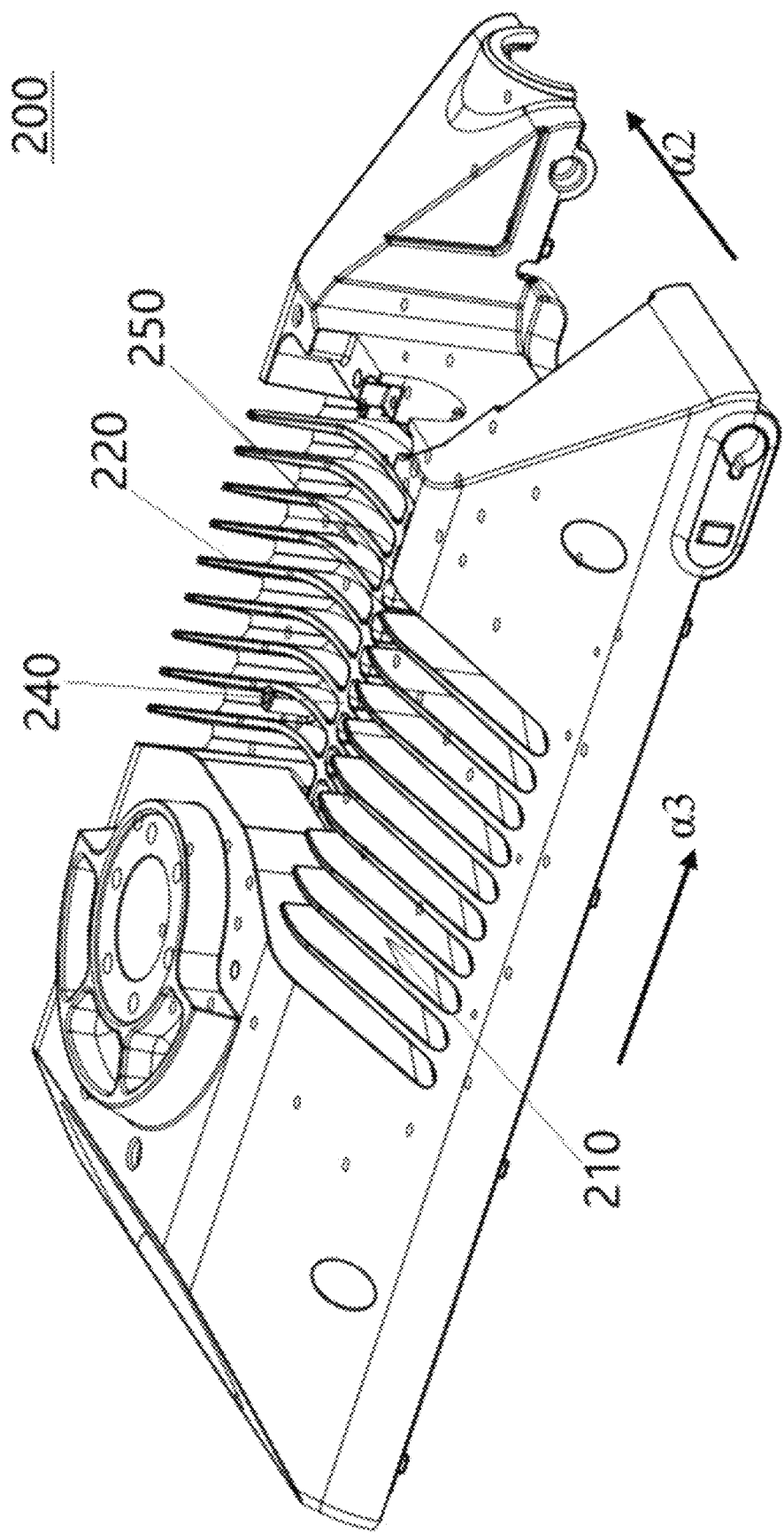
FIG. 4 is a perspective structural diagram of the cooling shell from an angle, according to some embodiments of the present application.
Figure 5:
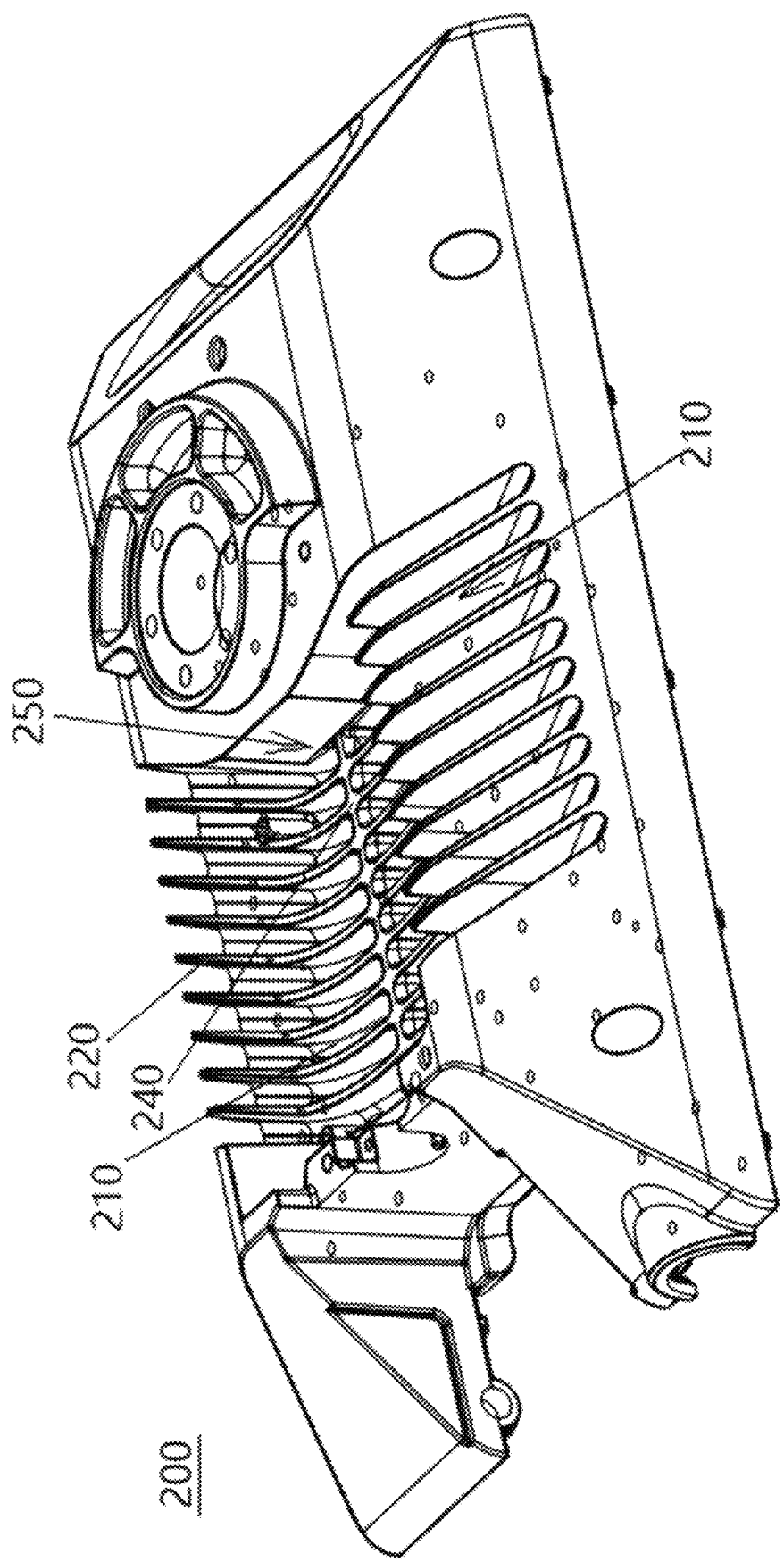
FIG. 5 is another perspective structural diagram of the cooling shell from a different angle, according to some embodiments of the present application.
Figure 6:
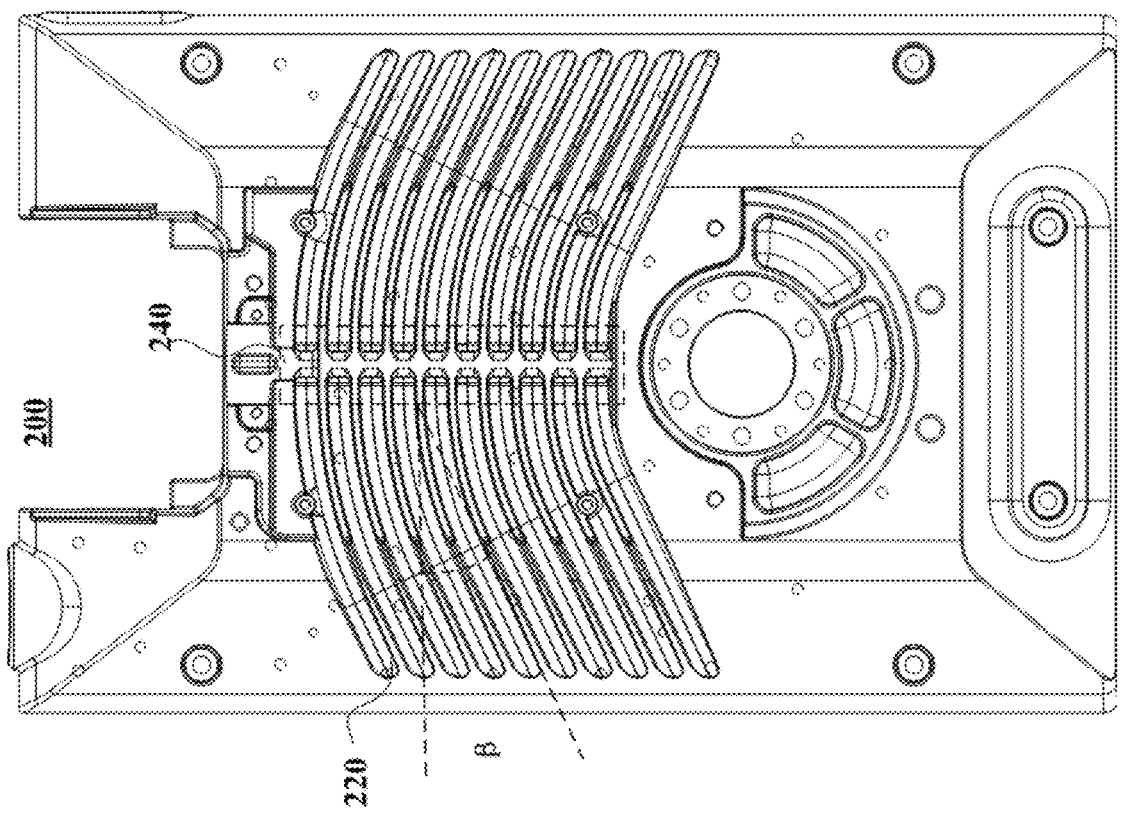
FIG. 6 is a top view structural diagram of the cooling shell, according to some embodiments of the present application.
Figure 7:
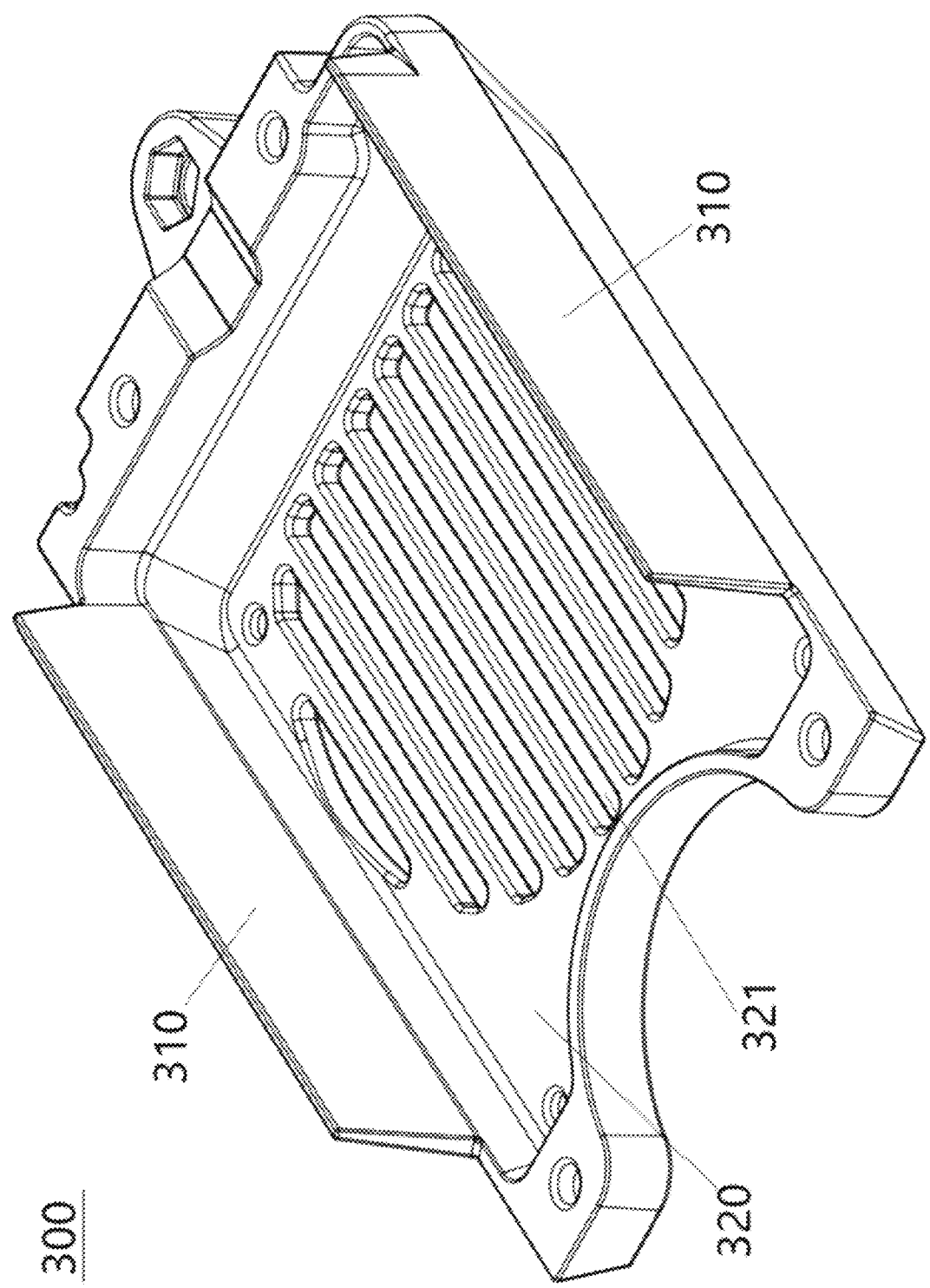
FIG. 7 is a perspective structural diagram of the foreign object baffle, according to some embodiments of the present application.

As shown in FIG. 3, in one example, the first direction α1 can be along the height direction of the shell. As shown in FIG. 4, in one example, the second direction α2 can be along the width direction of the shell.

In an embodiment of the cooling shell 200, the fins 220 are arranged in the third direction, and both the first direction and the second direction are perpendicular to the third direction.

As shown in FIG. 4, in one example, the third direction α3 can be along the length direction of the shell.

In one embodiment of the cooling shell 200, the fins 220 extend obliquely from a position near the cooling component installation groove 250 towards the direction near the heating component installation portion 230 relative to the first direction.

In one embodiment of the cooling shell 200, the fin portion may have 2 to 15 fins 220. For example, the fin portion has 3, 5, 7, 9, or 11 fins 220, etc. In another embodiment of the present application, the fin portion has 11 fins 220, and correspondingly, the fin portion has 10 flow channels 210.

The cooling shell 200 provided in this embodiment is used to install the heating component 400 in the heating component installation portion 230, and the fan 500 is installed in the cooling component installation groove 250. When the fan 500 is turned on, an airflow sends the heat transferred from the heating component 400 to the fin portion and away from the heating component 400. In the fin portion, the airflow carries the heat and flows through the flow channel 210, dissipating the heat. At the same time, since both the heating component installation portion 230 and the fin 220 are part of the shell, the heat generated by the heating component 400 is directly transferred to the fin 220. When the fan 500 generates airflow through the flow channel 210, it also takes away the heat on the fin 220. The fins 220 extend obliquely from a position near the cooling component installation groove 250 towards the direction near the heating component installation portion 230 relative to the first direction. This increases the contact area of the fin 220, resulting in better cooling effect. The cooling component installation groove 250 is formed on the shell, facilitating the installation of the fan 500 and reducing the overall volume of the chassis.

In an embodiment of the cooling shell 200, the cooling component installation groove 250 of the cooling component partially overlaps with the heating component installation portion 230 of the heating component in the first direction. This increases the contact area between the fan 500 and the heating component after installation, and the cooling component installation groove 250 is close to the heating component installation portion 230, thereby enhancing the cooling effect.

In an embodiment of the cooling shell 200, the projection length of the fins in the first plane is greater than the width of the flow channel. It is through this feature that the effect of making it difficult for the user to see the internal structure through the flow channel is achieved. Furthermore, it makes it difficult for the user to see the cooling component inside the cooling component installation groove in the second direction through the flow channel, thereby improving the user's perception of the electric propulsor.

In an embodiment of the cooling shell 200, a projection of the fins 220 in the first plane extends obliquely with respect to the second direction, and both the second direction and the third direction are parallel to the first plane. By extending the projection of the fins 220 inclined relative to the second direction, instead of making the projection of the fins 220 in the first plane perpendicular or parallel to the second direction, the size of the fins 220 can be relatively large within the limited width of the shell, thereby increasing the heat dissipation area of the fins 220 and improving the heat dissipation performance.

In an embodiment of the cooling shell 200, the projection of the fins 220 in the first plane includes a curved extension segment. On one hand, this can further increase the length of the fins 220, and on the other hand, it makes it difficult for the user to see the fan 500 inside the cooling component installation groove 250 through the flow channel 210 from the second direction, thus improving the user's perception of the electric propulsor.

In an embodiment of the cooling shell 200, the angle between the extension direction of the projection and the second direction is 10° to 30°. In this exemplary embodiment, the angle β between the extension direction of the projection and the second direction can be specifically 23°, 25°, 27°, or 29°, and preferably 25°.

In an embodiment of the cooling shell 200, the fins 220 extend inclined relative to the first direction in the second plane, and the first direction and the third direction are parallel to the second plane. This allows the fins 220 to have a larger size within the limited size of the shell, thereby increasing the heat dissipation area of the fins 220 and improving the heat dissipation capability. It also makes it difficult for users to see the cooling component in the cooling component installation groove 250 in the second direction through the flow channel, thereby improving the user's perception of the electric propulsor.

In an embodiment of the cooling shell 200, the shell body includes reinforcing ribs 240 extending in the third direction, the reinforcing ribs 240 are formed at the bottom of the cooling component installation groove 250, and the fin portion on both sides of the cooling component installation groove 250 are fixedly connected to the reinforcing ribs 240. The flow channel 210 extends to the reinforcing ribs 240 in the second direction. It can be understood that the reinforcing ribs 240 extend in the third direction, and the reinforcing ribs 240 are formed at the bottom of the cooling component installation groove 250. The width dimension of the reinforcing ribs 240 in the second direction is smaller than the dimension of the bottom of the cooling component installation groove 250 in the second direction. The flow channel 210 extends to the reinforcing ribs 240 in the second direction, thereby increasing the length of the flow channel 210, improving the heat dissipation capacity, and increasing the length of the fins 220, and thereby increasing the heat dissipation area and improving the heat dissipation capacity. By setting the reinforcing ribs 240, the lifting demand of the cooling shell 200 can be met. Specifically, the lifting demand refers to the need for the marine electric propulsor to lift the propeller part when it is not in use, so that the propeller is away from the water surface, avoiding long-term immersion of the propeller part in water. During the lifting process, by setting the reinforcing ribs 240, the rigidity of the cooling shell 200 can be increased, thereby avoiding deformation of the cooling shell 200 due to lifting, and meeting the lifting demand of the cooling shell 200.

In one embodiment of the cooling shell 200, the heating component installation portion 230 is a cooling base, so that the heating component installed on the cooling base conducts heat through the cooling base, thereby exchanging heat with the cooling base by the cooling air driven by the fan 500 installed in the cooling component installation groove 250, and then exchanging heat with the outside cold air through the fins 220.

In one embodiment of the cooling shell 200, the heating component installation portion is used to install the heating component, and a thermal conductive silicone grease layer is provided on the surface of the heating component.

Another aspect of the present application provides a chassis, including the cooling shell 200 provided in the embodiments of the present application.

The chassis provided in the embodiments of the present application adopts the cooling shell 200 provided in the embodiments of the present application. When in use, the heating component 400 is installed in the heating component installation portion 230, and the fan 500 is installed in the cooling component installation groove 250. The fan 500 is started to transfer the heat generated by the heating component 400 to the fin portion and away from the heating component 400. In the fin portion, the airflow carries heat and flows through the flow channel 210 to dissipate the heat. At the same time, since both the heating component installation portion 230 and the fin 220 are part of the shell body, the heat generated by the heating component 400 is directly transferred to the fin 220. When the fan 500 generates airflow through the flow channel 210, it also takes away the heat on the fin 220. The fin 220 is inclined and extends from a position near the cooling component installation groove 250 to a position near the heating component installation portion 230 in a direction opposite to the first direction, which increases the contact area of the fin 220 and improves the cooling effect. A cooling component installation groove 250 is formed on the shell body, which facilitates the installation of the fan 500 and reduces the overall volume of the chassis.

In one embodiment of the chassis, the chassis 1000 provided in this embodiment includes a bottom cover 300. The bottom cover 300 is installed in the cooling shell 200 and includes a main body portion 320. The main body portion 320 covers the notch of the cooling component installation groove 250.

In one embodiment of the chassis, a through hole 321 is formed on the main body portion 320. The through hole 321 passes through the main body portion 320 in a first direction. In this embodiment, it is preferred to connect the bottom cover 300 and the bottom of the cooling component installation groove 250 with screws after they are set opposite to each other. The fan 500 base is fixed to the lower shell of the chassis 1000. By using the bottom cover 300, the probability of foreign objects entering the cooling component installation groove 250 and causing the fan 500 to malfunction is reduced. The through hole 321 allows the airflow inside the fan 500 installation chamber to circulate normally.

In one embodiment of the chassis, the through hole 321 has multiple openings, and the opening rate of the through hole 321 on the main body 320 is 40%-90%. Considering factors such as the structure and the strength of the foreign object baffle 310 itself, the preferred opening rate is 40%. At this opening rate, the strength of the foreign object baffle 310 can be ensured while ensuring the air intake volume (as determined by experiments). During use, the fan 500 is started, and the air enters through the through hole 321 at the base of the fan 500 and flows out through the flow channel 210 formed by the fins 220.

In one embodiment of the chassis, the removable bottom cover 300 is connected to the cooling shell 200. When the fan 500 is damaged, it can be replaced without replacing the entire chassis 1000, saving costs and making disassembly and installation more convenient for easy use.

In one embodiment of the chassis, the bottom cover 300 also includes two foreign object baffles 310. The foreign object baffles 310 are formed on one side surface of the main body portion 320 facing the cooling component installation groove 250. The foreign object baffles 310 extend into the cooling component installation groove 250 to block a portion of the flow path, thereby preventing foreign objects from entering. During installation, the fan 500 is first placed on the main body portion, with the fan 500 located between the two foreign object baffles 310. Then, the bottom cover 300 is aligned with the slot of the cooling component installation groove 250, with the fan 500 and the two side foreign object baffles 310 located inside the cooling component installation groove 250, and the fan 500 is enclosed, effectively preventing foreign objects from entering and causing the fan 500 to malfunction. In this embodiment, after aligning the bottom cover 300 and the fan 500 with the cooling component installation groove 250, the fan 500 base is fixed to the cooling shell 200 by screwing it into the threaded hole.

In an embodiment of the chassis, the chassis 1000 provided in this embodiment also includes a top shell 100, which is connected to the cooling shell 200. A housing cavity is formed between the top shell 100 and the cooling shell 200, and the containing cavity is used to install a heating component 400. The outer surface of the chassis 1000 is an oxidized surface, and outdoor powder is sprayed on the outer surface. By making the outer surface of the chassis 1000 an oxidized surface and coating it with corresponding outdoor powder to form a coating, the chassis 1000 can have the functions of weather resistance and corrosion resistance, thereby prolonging its service life.

In one embodiment of the chassis, the chassis 1000 provided in this application embodiment also includes a heating component and a fan 500. The heating component 400 is installed on the heating component installation portion 230, and the fan 500 is installed in the heating component installation groove 250.

In one embodiment of the chassis, thermal grease is applied to the heating component installation portion 230, so that the thermal grease is sandwiched between the heating component 400 and the heating component installation portion 230 when the heating component 400 is installed.

Based on the above embodiment of the chassis, this application also provides a marine electric propulsor, which includes a heating component and a chassis 1000. The heating component includes a driving component of the marine electric propulsor, which is installed on the heating component installation portion. The chassis is equipped with a driving component. The marine electric propulsor also includes a motor connected to the driving component, and a propeller driven by the motor, which provides propulsion power for the vessel. The marine electric propulsor also includes a power source such as a battery or solar energy, wind energy, hydrogen energy, etc., to supply power to the driving component.

Taking the driving component driven by the heating component 400 as an example, the driving component of the marine electric propulsor is fixedly installed on the heating component installation part 230. By increasing the contact area of the fins, the cooling effect of the driving component of the marine electric propulsor is improved. A cooling component installation groove is formed on the shell, which facilitates the installation of the cooling component and can reduce the volume of the entire chassis of the marine electric propulsor, thereby effectively improving the cooling effect of the driving component in the marine electric propulsor and enhancing the overall usability of the marine electric propulsor.

In an embodiment of the marine electric propulsor, temperature sensors are respectively provided on the driving component, motor, and battery of the marine electric propulsor. The temperature sensors are used to detect temperature signals and send them to the control module of the marine electric propulsor. Speed sensors are also respectively provided on the motor and cooling components of the marine electric propulsor. The speed sensors are used to detect motor speed signals and cooling component speed signals, and to send them to the control module. The control module is also connected to the motor and cooling components, and is used to receive temperature signals, motor speed signals, and cooling component speed signals. It is also used to control the speed of the motor and cooling components. By setting multiple sensors, the control module of the marine electric propulsor can perform timely and automatic cooling treatment on each heating component of the marine electric propulsor, thereby further improving the application reliability and service life of the marine electric propulsor.

Figure 8:
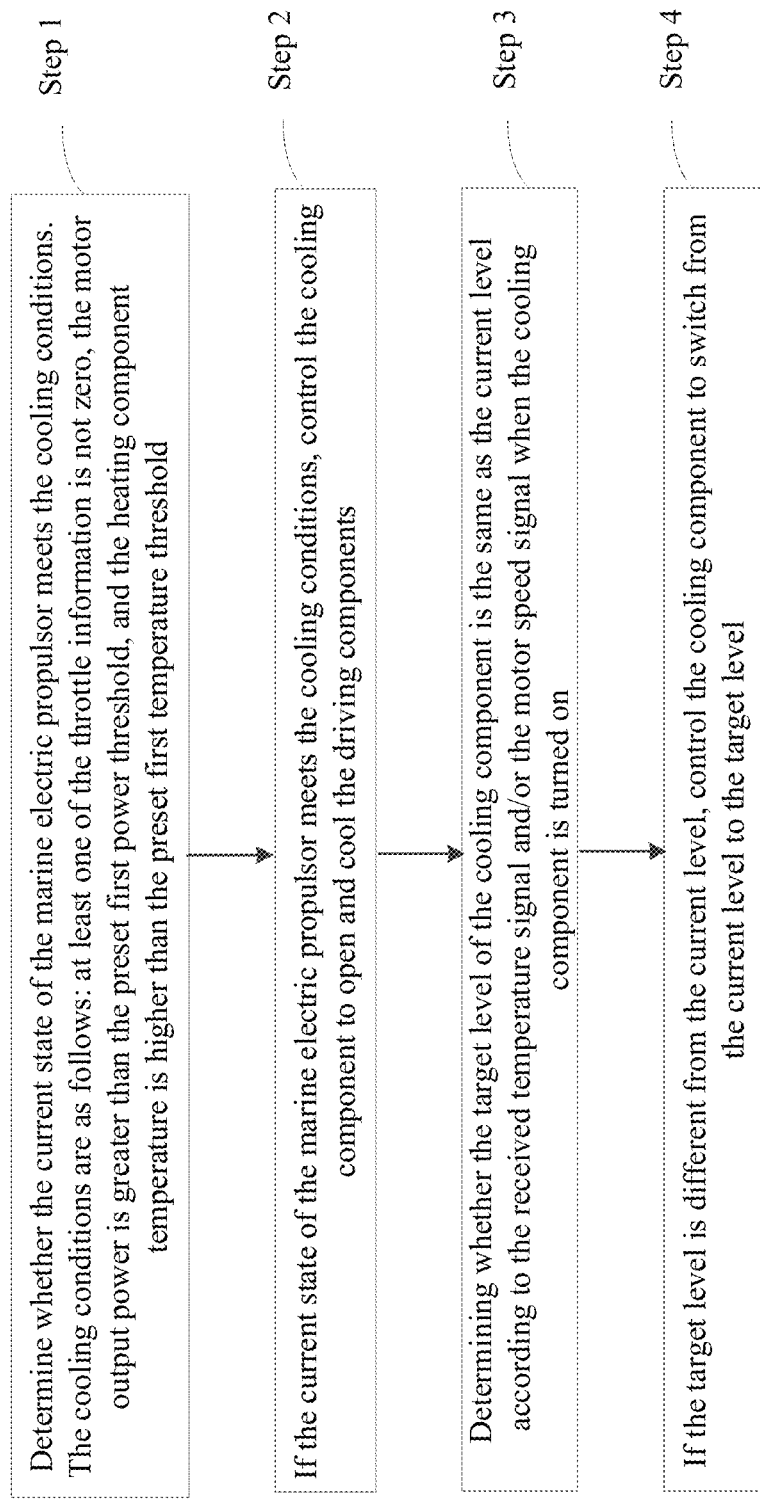
FIG. 8 is a schematic diagram of the process of the cooling control method, according to some embodiments of the present application.

Based on the above-mentioned embodiment of the marine electric propulsor, the present application also provides a cooling control method, which is implemented using the control module in the marine electric propulsor, as shown in FIG. 8. The specific content of the cooling control method includes the following content.

Step 1: Determine whether a current state of a marine electric propulsor meets cooling conditions. The cooling conditions include meeting at least one of: the throttle information being not zero; motor output power being greater than a preset first power threshold; or heating component temperature being higher than a preset first temperature threshold.

Step 2: If the current state of the marine electric propulsor meets the cooling conditions, control a cooling component to open and cool the driving components.

In steps 1 and 2: when it is detected that the throttle information is not 0/motor speed/motor output power is not zero, or the motor output power exceeds the preset first power threshold or the heating component temperature is higher than the preset first temperature threshold, the cooling device starts cooling. If it is detected that the throttle information of the marine propulsor is 0, or the motor power is less than the preset second power threshold or the heating component temperature is lower than the preset second temperature threshold, the cooling device is turned off. The first temperature threshold and the second temperature threshold can also be set to the same value, and the first power threshold can be less than the second power threshold.

Step 3: Determining whether a target level of the cooling component is the same as a current level according to a received temperature signal and/or a motor speed signal when the cooling component is turned on.

Step 4: If the target level is different from the current level, control the cooling component to switch from the current level to the target level.

In steps 3 and 4, taking the fan as an example, when the fan is started, if the control module of the marine propulsor detects that the temperature or motor output power of the heating component meets the requirements of different fan levels, level adjustment is performed. An example of specific level division is as follows:

Level 1 (Level 1 wind power): under the condition of fan operation, the temperature is lower than the preset third temperature threshold and the power is less than the preset third power threshold.

Level 2 (Level 2 wind power): under the condition of fan operation, the temperature is higher than the preset third temperature threshold and lower than the preset fourth temperature threshold, and the power is less than the preset third power threshold.

Level 3 (Level 3 wind power): under the condition of fan operation, the temperature is higher than the preset fifth temperature threshold or the power is greater than the preset fourth power threshold.

In some embodiments, the wind power percentage of level 1 to level 3 increases sequentially. The values of the third temperature threshold, fourth temperature threshold, and fifth temperature threshold can increase sequentially. The third power threshold can be less than the fourth power threshold and greater than the second power threshold.

If the cooling component is a fan, the above step 1 of the cooling control method also specifically includes the following content.

Controlling the fan to power on for self-check, wherein the self-check includes: if the fan does not rotate during the preset duration in the preset mode, outputting a notification message indicating a fan failure.

In other words, before step 1, a power-on self-test can also be performed: the fan is powered on and automatically runs at full speed for a preset time. During this time, the fan rotation is detected. If there is no rotation, a fan failure is displayed, but it does not affect the operation of the marine propulsor. If the user operates the throttle of the marine propulsor, the motor of the marine propulsor can still operate. If the fan rotates, no fan failure is displayed.

Furthermore, the cooling control method provided in the present embodiment can further improve the intelligence level of heat dissipation for heating components such as the drive components in the marine electric propulsor by automatically switching the fan speed.

Based on the above content, this application also provides a control module for implementing the cooling control method provided in the embodiments of this application. The control module can be a controller that can communicate with various client devices, apps, mechanical throttles, electronic throttles, and other input devices in sequence, either by itself or through third-party servers. Users can input the target motor speed or target power through this input device. The control module can receive the target motor speed or target power sent by the input device to adjust the output thrust of the marine propulsor. The control module can also send control results and cooling detection results to the user's client device.

It can be understood that the client device can include mobile devices that can load applications, such as smartphones, tablets, network set-top boxes, laptops, personal digital assistants (PDAs), car devices, and smart wearable devices. Among them, smart wearable devices can include smart glasses, smart watches, smart bracelets, etc.

The above-mentioned client devices can have a communication module (i.e., a communication unit) to communicate with remote servers and achieve data transmission with the server. The server can include a server on the task scheduling center side, and in other implementation scenarios, it can also include a server on an intermediate platform, such as a server on a third-party server platform that has a communication link with the task scheduling center server. The server can include a single computer device, or it can be composed of multiple servers forming a server cluster, or a server structure of a distributed device.

The above-mentioned servers and the client devices can communicate using any suitable network protocol, including network protocols that have not been developed as of the filing date of this application. The network protocols may include TCP/IP protocol, UDP/IP protocol, HTTP protocol, HTTPS protocol, etc. Of course, the network protocols may also include RPC protocol (Remote Procedure Call Protocol) and REST protocol (Representational State Transfer) used on top of the above-mentioned protocols.

Figure 9:
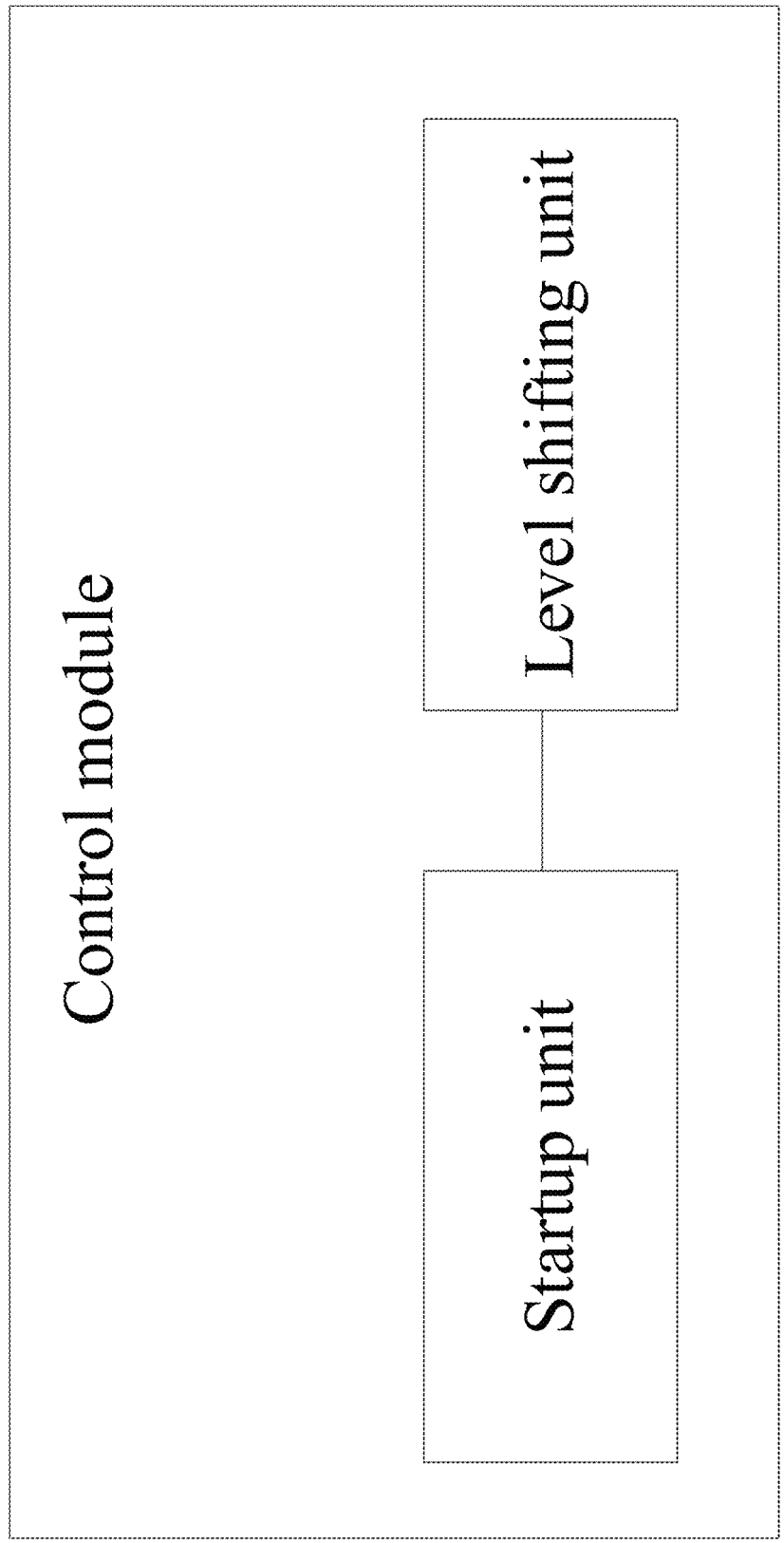
FIG. 9 is a structural schematic diagram of the control module, according to some embodiments of the present application.

Based on this, the present application provides an embodiment of a control module for executing all or part of the content of the cooling control method. Please refer to FIG. 9. The control module 900 specifically includes the following content:

Startup unit 910, used to control the cooling component to open and cool the driving components if it is detected that the current state of the marine electric propulsor meets the cooling conditions.

Level shifting unit 920, used to control the cooling component to switch from the current level to the target level if it is determined based on the received temperature signal and/or motor speed signal that the target level of the cooling component is different from the current level during the opening of the cooling component.

The embodiments of the control module provided in this application can be specifically used to execute the processing flow of the implementation examples of the cooling control method described above. The functions of the embodiments are not described here and can be referred to the detailed description of the method implementation examples mentioned above.

From the above description, it can be known that the control module provided in this application example can further improve the intelligence of heat dissipation for heating components such as the driving components in marine electric propulsors by automatically switching the level position of the heat dissipation device.

In order to further illustrate this solution, this application example provides a marine electric propulsor and its cooling control method, as shown in FIGS. 1 to 7. The marine electric propulsor includes a chassis, driving components, power lines, fans, shafts, motors, propellers, fixtures, and a GPS module. The motor is connected to the propeller to drive its rotation. The shafts are connected to the chassis and the motor, and the rotation of the chassis can drive the shafts, motor, and propeller to adjust the direction of the propeller. The fixture is set on the shaft and located below the chassis, used to clamp the marine electric propulsor to the stern plate of the ship. The power line is used to connect the battery. The GPS module is built-in inside the chassis for positioning.

Among them, the driving components are used to drive the motor, and the driving components, motor, or battery will generate a large amount of heat during the operation of the outboard motor. In some schemes, the heating components such as the driving components, motor, or battery are set in the chassis. This application example adopts air cooling to dissipate heat for these heating components set in the chassis.

The main improvement lies in the chassis of the marine electric propulsor. The chassis includes an upper shell and a lower shell. The driving components include a driving board and a driving seal cover. The lower shell of the chassis is provided with a heat dissipation base for installing the driving components. In this embodiment, the heat dissipation base is made of aluminum plate. It can be understood that the heat dissipation base can also be made of copper plate or steel plate. The driving components are installed on the heat dissipation base through screws, and the heat dissipation base is coated with thermal grease, which is located between the heat dissipation base and the driving components. Coating thermal grease can accelerate heat conduction and improve heat dissipation efficiency. The upper shell and the lower shell of the chassis are covered, and the driving components and GPS module are located inside the chassis.

Fins are set below the lower shell of the chassis, and there is a certain angle between the fins on both sides of the lower shell and the horizontal line. The projection length of the fins in the first plane is greater than the width of the flow channel, which ensures that the internal fan cannot be seen when looking from the direction of the flow channel into the chassis, making it aesthetically pleasing while increasing the heat dissipation area (compared to the fins that do not form a certain angle with the first plane), resulting in better heat dissipation effect. Specifically, combined with thermal simulation, the number and angle of the flow channels are optimized. The number of flow channels is set to 10, and the angle between the fins and the horizontal line is set to 25°. The specific number of flow channels and the angle of the fins are not limited to this.

Next, the fins on both sides extend along the direction close to the upper shell of the chassis. The concave part of the lower shell of the chassis between the fins forms an installation cavity for fan assembly. At the same time, there is a groove on the installation cavity that is connected to the flow channel formed by the fins, forming a complete flow channel, which makes the middle part of the flow channel closer to the heat sink. Compared with being far away from the heat sink, it can further enhance the cooling effect.

Reinforcing ribs are installed on the installation cavity to meet the lifting requirement of the lower shell of the chassis (as shown in FIG. 3). The lifting requirement means that when the marine electric propulsor is not in use, the propeller part needs to be lifted up, so that the propeller is away from the water surface to avoid long-term immersion in water. During the lifting process, by setting reinforcing ribs, the rigidity of the chassis can be increased to prevent deformation of the chassis due to lifting, so as to meet the lifting requirement of the chassis.

An installation cavity is formed between the lower shell of the chassis and the fins on both sides, providing space for the installation of the fan. This reduces the volume and weight of the entire chassis, making it easier to transport and use. The position of the installation cavity formed with the fan assembly is aligned with the cooling base, and the position of the installation cavity is within a certain range of error.

Fan baffles are set on both sides of the fan base. The fan base has threaded holes for assembling the fan and the lower shell of the chassis, and there are through holes at the bottom of the fan base. During installation, the fan is first placed on the fan base, with the fan located between the side plates. Then align the fan base with the installation cavity, with the fan and the two side fan baffles inside the installation cavity, effectively preventing foreign objects from entering and causing the fan to malfunction. After aligning the fan base with the installation cavity, secure the fan base to the lower shell of the chassis by screwing it into the threaded holes.

In this application example, the opening rate of the vent hole in the fan base is between 40% and 90%. Considering factors such as the structure and the strength of the fan base itself, an opening rate of 40% is chosen. At this opening rate, the strength of the fan base can be ensured while also ensuring the air intake volume (determined through experiments). During use, when the fan is started, air enters through the openings in the fan base and flows out through the channels formed by the fins.

Furthermore, surface treatment is performed on the chassis, such as oxidation and spraying outdoor powder. Coating the corresponding layers achieves weather resistance and corrosion resistance, which can extend the service life of the chassis.

In addition, the opening shape of the fan mounting plate is not limited to straight openings, but can also be radial or grid openings, and other common opening methods. The angle of the fins and the number of flow channels can also be adjusted; in addition to thermal grease, other materials that can increase the thermal conductivity efficiency can also replace thermal grease.

Figure 10:
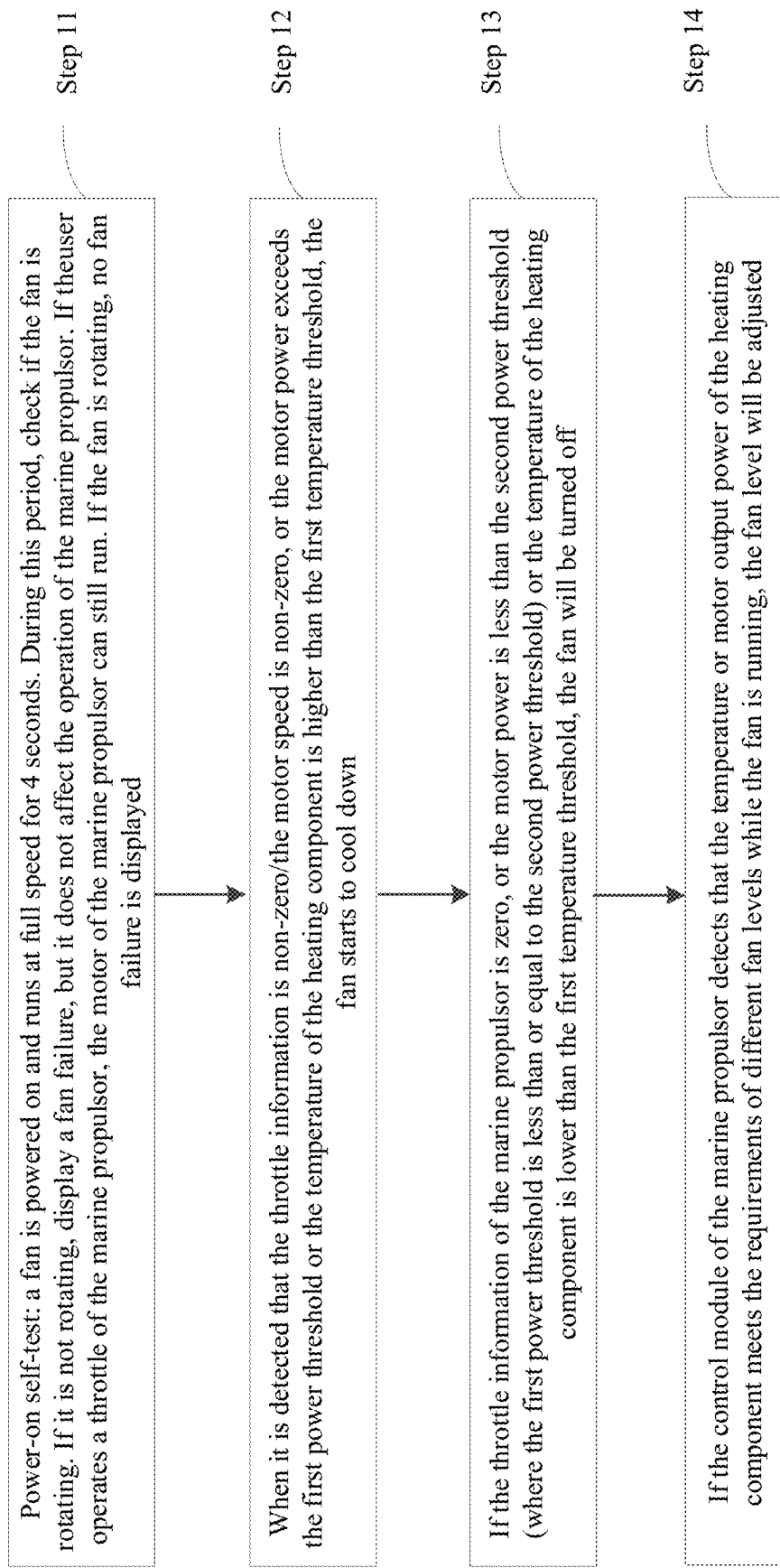
FIG. 10 is a schematic diagram of the process of the fan control method, according to some embodiments of the present application.

In addition, this application example also provides a cooling control method, which is not limited to cooling by air cooling, but can also be cooled by water cooling using a water pump. When the marine propulsor is working, the driver, motor, battery, and other components will generate a large amount of heat. Temperature sensors can be installed in these heating components to detect temperature information. The marine propulsor includes an input device (such as a mechanical throttle, electronic throttle, or mobile app), through which the user inputs the target motor speed or target power to adjust the output thrust of the marine propulsor, thereby achieving speed control of the boat. The marine propulsor also includes a sensor for obtaining the motor speed and a control module. The control module can obtain temperature information of the heating components, motor speed/power information, and fan speed information, and use them to control the motor speed or fan speed. Refer to FIG. 10 for the specific method for fan control.

Step 11: Power-on self-test: a fan is powered on and runs at full speed for 4 seconds. During this period, check if the fan is rotating. If it is not rotating, display a fan failure, but it does not affect the operation of the marine propulsor. If the user operates a throttle of the marine propulsor, the motor of the marine propulsor can still run. If the fan is rotating, no fan failure is displayed.

Step 12: When it is detected that the throttle information is non-zero/the motor speed is non-zero, or the motor power exceeds the first power threshold or the temperature of the heating component is higher than the first temperature threshold, the fan starts to cool down.

Step 13: If the throttle information of the marine propulsor is zero, or the motor power is less than the second power threshold (where the first power threshold is less than or equal to the second power threshold) or the temperature of the heating component is lower than the first temperature threshold, the fan will be turned off.

Step 14: If the control module of the marine propulsor detects that the temperature or motor output power of the heating component meets the requirements of different fan levels while the fan is running, the fan level will be adjusted.
1) Level 1 (33% wind power): With the fan turned on, the temperature is lower than the second temperature threshold and the power is less than the rated power of the motor.
2) Level 2 (Wind Power 66%): With the fan turned on, the temperature is higher than the second temperature threshold and lower than the third temperature threshold, and the power is less than the rated power of the motor.
3) Level 3 (Wind Power 100%): With the fan turned on, the temperature is higher than the third temperature threshold or the power is greater than the rated power of the motor.

The fan can be powered by the power supply of the marine electric propulsor, or it can be separately powered by an independent power supply. For example, when powered by the power supply of the marine electric propulsor, the fan is powered on at the same time as the propulsor and performs a self-check.

In another solution, the fan can continue to run for a certain period of time after detecting that the throttle information of the marine propulsor is not zero, which accelerates the dissipation of residual heat.

The above control method is also applicable to the case where the fan is replaced with a water pump. Similar to the fan speed, the water pump can achieve the same effect by adjusting the flow rate or flow.

In summary, the marine electric propulsor and its cooling control method provided in this application example ensure better heat dissipation and control by maximizing the overlapping area in the spatial arrangement of the fin structure, fan base structure, assembly position of the drive components, assembly relationship, application of thermal grease on the drive components and heat dissipation base, reinforcing ribs, installation position of the driver, and positioning of the fins and fan. This application example has the following beneficial effects:
1. The designed fins extend in the direction close to the upper shell of the chassis, and compared with the straight fins, it can increase the contact area and improve the cooling effect. At the same time, the concave part is formed in the middle of the fins to form an installation cavity, which is convenient for fan installation and can reduce the volume of the entire chassis. At the same time, the middle part of the fins is close to the cooling base, increasing the contact area and enhancing the cooling effect.
2. The fan base is detachable. When the fan is damaged, it can be replaced without replacing the entire chassis, which can save costs and make the disassembly and installation more convenient and user-friendly.
3. By implementing surface treatment, it achieves weather resistance and corrosion resistance, effectively prolonging the service life of the chassis.
4. It has a simple structure, which can achieve a large heat dissipation area and excellent heat dissipation effect.
5. By setting a baffle on the fan base, it can effectively block foreign objects from entering the chassis, ensuring the normal operation of the fan and thus ensuring the normal heat dissipation of the marine electric propulsor.
6. By adding reinforcing ribs in the middle part of the fins, it can meet the requirements of chassis warping and ensure the rigidity of the chassis.

From the hardware perspective, this application provides an embodiment of an electronic device for implementing all or part of the content of the cooling control method. The specific contents of the electronic device are as follows.

Figure 11:
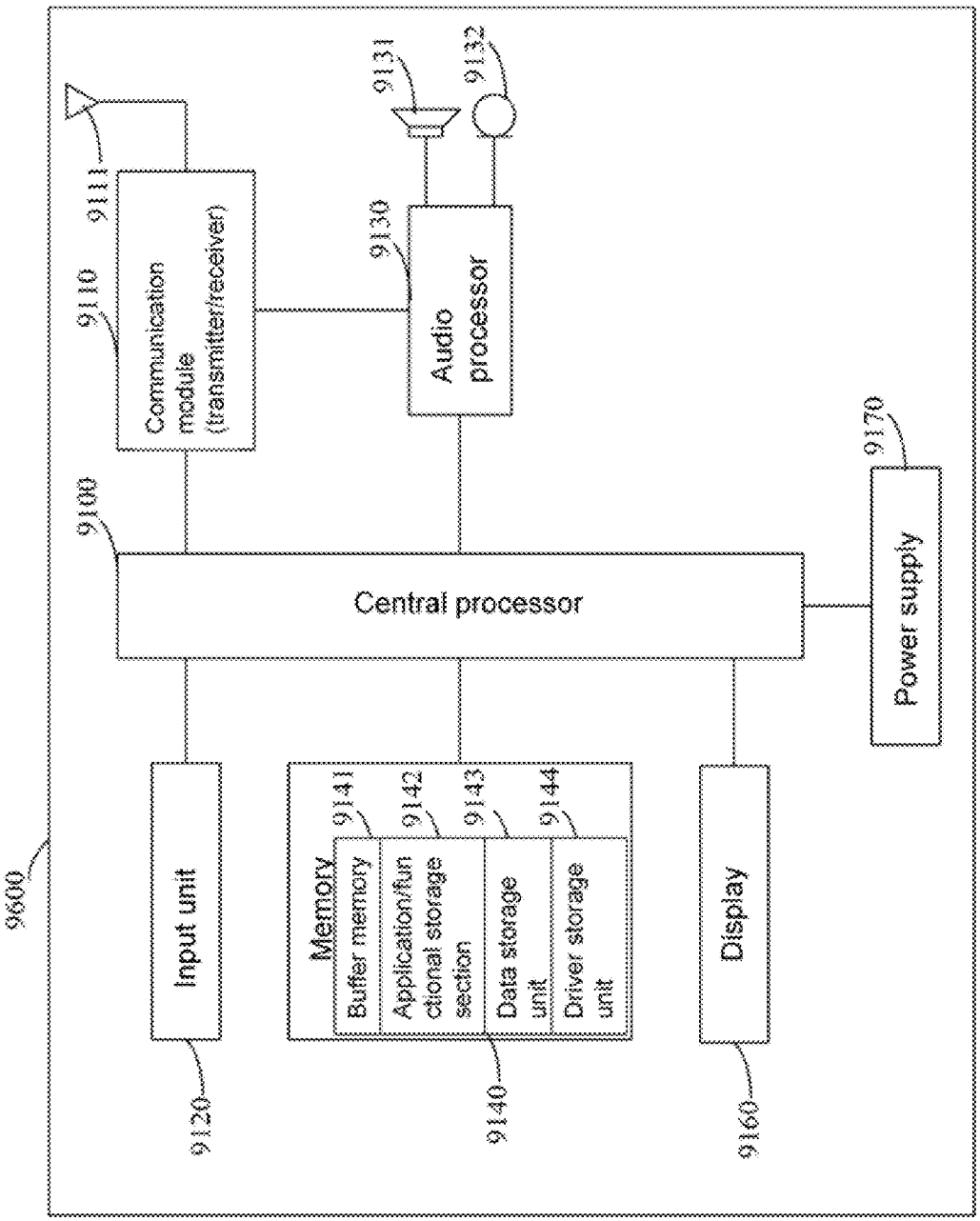
FIG. 11 is a structural schematic diagram of the electronic device, according to some embodiments of the present application.

FIG. 11 is a schematic diagram of the system configuration of the electronic device 9600 according to an embodiment of the present application. As shown in FIG. 11, the electronic device 9600 may include a central processor 9100 and a memory 9140; and the memory 9140 is coupled to the central processor 9100. It should be noted that FIG. 11 is exemplary; other types of structures can be used to supplement or replace this structure to achieve telecommunication functions or other functions.

In one embodiment, the cooling control function can be integrated into the central processor. The central processor can be configured to perform the following control:
Step 1: If it is detected that the current state of the marine electric propulsor meets the cooling conditions, control the cooling component to open and cool the drive components.
Step 2: Determining whether the target level of the cooling component is the same as the current level according to the received temperature signal and/or the motor speed signal when the cooling component is turned on. If not, control the cooling component to switch from the current level to the target level.

In another embodiment, the control module can be configured separately from the central processor 9100, for example, the control module can be configured as a chip connected to the central processor 9100 to achieve cooling control function through the control of the central processor.

As shown in FIG. 11, the electronic device 9600 may also include: communication module 9110, input unit 9120, audio processor 9130, display 9160, power supply 9170. It should be noted that the electronic device 9600 is not necessarily required to include all the components shown in FIG. 11; and in addition, the electronic device 9600 may also include components not shown in FIG. 11, which can be referred to existing technology.

As shown in FIG. 11, the central processor 9100, sometimes referred to as a controller or control device, can include a microprocessor or other processing device and/or logic device. The central processor 9100 receives input and controls the operation of various components of the electronic device 9600.

Among them, the memory 9140 can be a cache, flash memory, hard drive, removable media, volatile memory, non-volatile memory, or other suitable device. It can store information related to failures and also store programs that execute information-related tasks. The central processor 9100 can execute the program stored in the memory 9140 to achieve information storage or processing.

The input unit 9120 provides input to the central processor 9100. The input unit 9120 can be, for example, a keyboard or a touch input device. The power supply 9170 provides power to the electronic device 9600. The display 9160 is used to display objects such as images and text. The display can be, for example, an LCD display, but is not limited to this.

The memory 9140 can be a solid-state memory, such as read-only memory (ROM), random access memory (RAM), SIM card, etc. It can also be a memory that retains information even when power is disconnected, can be selectively erased, and has more data. Examples of such memory are sometimes referred to as EPROM. The memory 9140 can also be some other type of device. The memory 9140 includes a buffer memory 9141 (sometimes referred to as a buffer). The memory 9140 can include an application/functional storage section 9142, which is used to store application programs and functional programs or to perform operations of the electronic device 9600 through the central processor 9100.

The storage device 9140 may also include a data storage unit 9143, which is used to store data such as contacts, digital data, images, sounds, and/or any other data used by electronic devices. The driver storage unit 9144 of the storage device 9140 may include various drivers for communication functions and/or other functions of the electronic device (such as messaging applications, address book applications, etc.).

The communication module 9110 is a transmitter/receiver 9110 that sends and receives signals via antenna 9111. The communication module (transmitter/receiver) 9110 is coupled to the central processor 9100 to provide input signals and receive output signals, similar to a conventional mobile communication terminal.

Based on different communication technologies, multiple communication modules 9110 can be set in the same electronic device, such as cellular network modules, Bluetooth modules, and/or wireless LAN modules, etc. The communication module (transmitter/receiver) 9110 is also coupled to the speaker 9131 and microphone 9132 via the audio processor 9130, providing audio output through the speaker 9131 and receiving audio input from the microphone 9132, thus achieving typical telecommunication functions. The audio processor 9130 can include any suitable buffers, decoders, amplifiers, etc. Additionally, the audio processor 9130 is also coupled to the central processor 9100, enabling recording on the device through the microphone 9132 and playback of stored sound through the speaker 9131.

Technical personnel in this field should understand that the embodiments of the present application can provide methods, devices, or computer program products. Therefore, the present application can be implemented in the form of completely hardware embodiments, completely software embodiments, or embodiments combining software and hardware aspects. Moreover, the present application can be implemented in the form of a computer program product stored on one or more computer-readable storage media (including but not limited to disk storage, CD-ROM, optical storage, etc.) containing computer-executable program code.

Specific embodiments have been described to illustrate the principles and implementation methods of the present application. The description of the above embodiments is only intended to assist in understanding the methods and core ideas of the present application. At the same time, for those skilled in the art, based on the ideas of the present application, there may be changes in specific implementation methods and application scope. In summary, the contents of this specification should not be understood as limiting the present application.

What is claimed is:

1. A cooling shell, comprising a shell body, wherein the shell body comprises a fin portion, a heating component installation portion, and a cooling component installation groove, and wherein
    the heating component installation portion is formed on one side of the shell body in a first direction for installing a heating component, and the cooling component installation groove is formed on the other side of the shell body for accommodating a cooling component;
    a connected flow channel is formed between the fin portion and the cooling component installation groove;
    the fin portion and the cooling component installation groove are positioned on a same side of the shell body, and the fin portion is arranged around the cooling component installation groove;
    the fin portion comprises multiple fins, and a flow channel communicating with the cooling component installation groove is formed between two adjacent fins;
    the fins extend obliquely relative to the first direction from a position near the cooling component installation groove towards a direction near the heating component installation portion; and
    the fin portions are formed on both sides of the cooling component installation groove in a second direction, the fins are arranged in a third direction, and the first direction and the second direction are both perpendicular to the third direction.

2. The cooling shell of claim 1, wherein a projection of the fins in a first plane extends obliquely with respect to the second direction, and both the second direction and the third direction are parallel to the first plane.

3. The cooling shell of claim 2, wherein the projection of the fins in the first plane comprises a curved extension segment.

4. The cooling shell of claim 2, wherein an angle between an extension direction of the projection and the second direction is 10° to 30°.

5. The cooling shell of claim 1, wherein a projection of the fins in a second plane extends obliquely relative to the first direction, and both the first direction and the third direction are parallel to the second plane.

6. The cooling shell of claim 1, wherein the cooling component installation groove at least partially overlaps with the heating component installation portion in the first direction.

7. The cooling shell of claim 1, wherein a projected length of the fins in a first plane is greater than a width of the flow channel.

8. The cooling shell of claim 1, wherein the shell body comprises reinforcing ribs extending in the third direction, and the reinforcing ribs are formed at a bottom of the cooling component installation groove, the fin portions on both sides of the cooling component installation groove are fixedly connected to the reinforcing ribs; and the flow channel extends to the reinforcing ribs in the second direction.

9. The cooling shell of claim 1, wherein the cooling component installation groove is configured to install a cooling component, and the cooling component comprises: a fan and/or a water cooling module.

10. A chassis, comprising the cooling shell of claim 1.

11. The chassis of claim 10, wherein the chassis comprises a bottom cover, the bottom cover is installed on the cooling shell, the bottom cover comprises a main body, and the main body covers a notch of the cooling component installation groove.

12. The chassis of claim 10, wherein the chassis comprises a top shell that is connected to the cooling shell, a housing cavity forms between the top shell and the cooling shell, and the housing cavity is configured to install the heating component.

13. The chassis of claim 10, wherein the chassis comprises the heating component and the cooling component, the heating component is installed on the heating component installation portion, and the cooling component is installed in the cooling component installation groove.

14. A marine electric propulsor, comprising the chassis of claim 10, wherein the heating component comprises a driving component of the marine electric propulsor, and the heating component is installed on the heating component installation portion.

15. The marine electric propulsor of claim 14, wherein
the driving component, a motor, and battery of the marine electric propulsor are respectively equipped with temperature sensors, and the temperature sensors are configured to detect temperature signals and send them to a control module of the marine electric propulsor;
the motor and a cooling component of the marine electric propulsor are also respectively equipped with speed sensors, and the speed sensors are configured to detect motor speed signals and cooling component speed signals, and send them to the control module; and
the control module is also respectively connected to the motor and the cooling component, and the control module is configured to receive the temperature signals, the motor speed signals, and the cooling component speed signals, and to control a speed of the motor and the cooling component.

16. A cooling control method, by applying the control module in the marine electric propulsor of claim 15, the cooling control method comprising:
determining whether a current state of the marine electric propulsor meets cooling conditions, wherein the cooling conditions comprise at least one of: throttle information not being zero, a motor output power being greater than a preset first power threshold, or a heating component temperature being higher than a preset first temperature threshold, wherein, in response to the current state of the marine electric propulsor meeting the cooling conditions, the cooling component is controlled to open for cooling a driving component; and
determining whether a target level of the cooling component is the same as a current level according to a received temperature signal and/or a motor speed signal when the cooling component is turned on, wherein, in response to the target level being different from the current level, the cooling component is controlled to switch from the current level to the target level.

17. A cooling control method of claim 16, wherein the cooling component comprises at least a fan, and
wherein before determining whether the current state of the marine electric propulsor meets the cooling conditions, the cooling control method further comprises:
controlling the fan to power on for self-check, wherein the self-check comprises:
when the fan does not rotate during a preset duration in a preset mode, outputting a notification message indicating a fan failure.

\* \* \* \* \*